(12) United States Patent
Ji et al.

(10) Patent No.: US 12,463,595 B2
(45) Date of Patent: Nov. 4, 2025

(54) DOHERTY POWER AMPLIFIER

(71) Applicant: Qorvo US, Inc., Greensboro, NC (US)

(72) Inventors: Ming Ji, Melrose, MA (US); Douglas Andrew Teeter, Lexington, MA (US)

(73) Assignee: Qorvo US, Inc., Greensboro, NC (US)

( * ) Notice: Subject to any disclaimer, the term of this patent is extended or adjusted under 35 U.S.C. 154(b) by 369 days.

(21) Appl. No.: 18/163,575

(22) Filed: Feb. 2, 2023

(65) Prior Publication Data

US 2023/0291359 A1 Sep. 14, 2023

Related U.S. Application Data

(60) Provisional application No. 63/318,504, filed on Mar. 10, 2022.

(51) Int. Cl.
| | |
|---|---|
| H04B 1/04 | (2006.01) |
| H03F 1/02 | (2006.01) |
| H03F 3/24 | (2006.01) |
| H03F 3/45 | (2006.01) |
| H04B 1/40 | (2015.01) |

(52) U.S. Cl.
CPC ........... *H03F 1/0288* (2013.01); *H03F 3/245* (2013.01); *H03F 3/45475* (2013.01); *H04B 1/04* (2013.01); *H03F 2200/222* (2013.01); *H03F 2200/267* (2013.01); *H03F 2200/451* (2013.01);
(Continued)

(58) Field of Classification Search
CPC .... H03F 1/0288; H03F 3/245; H03F 3/45475; H03F 2200/222; H03F 2200/267; H03F 2200/451; H03F 2200/481; H03F 2203/21127; H03F 2200/471; H03F 2203/45621; H03F 2203/45731; H03F 1/0266; H03F 3/211; H03F 3/26; H03F 3/4508; H03F 3/602; H03F 2200/534; H03F 2200/537; H03F 2200/541; H03F 2200/543; H03F 3/195; H03F 1/0211;
(Continued)

(56) References Cited

U.S. PATENT DOCUMENTS

| | | |
|---|---|---|
| 6,469,581 B1 | 10/2002 | Kobayashi |
| 6,864,742 B2 | 3/2005 | Kobayashi |

(Continued)

OTHER PUBLICATIONS

Kim, S et al., "A 24.5-29.5GHz Broadband Parallel-to-Series Combined Compact Doherty Power Amplifer in 28-nm Bulk CMOS for 5G Applications," 2021 IEEE Radio Frequency Integrated Circuits Symposium, Jun. 7-9, 2021, Atlanta, GA, USA, IEEE, pp. 171-174.

(Continued)

*Primary Examiner* — Andrew Wendell
(74) *Attorney, Agent, or Firm* — Withrow & Terranova, P.L.L.C.

(57) ABSTRACT

Disclosed is an amplifier having a carrier amplifier configured as a common-emitter carrier power stage and a peaking amplifier configured as a common-emitter peaking power stage. Further included is power adaptive biasing circuitry coupled between the carrier amplifier and the peaking amplifier, wherein the power adaptive biasing circuitry is configured to sense direct current base voltages of the common-emitter carrier power stage and to generate control currents that debias the common-emitter carrier power stage in response to the current base voltages of the common-emitter carrier power stage.

27 Claims, 16 Drawing Sheets

(52) U.S. Cl.
CPC .................. *H03F 2200/481* (2013.01); *H03F 2203/21127* (2013.01)

(58) Field of Classification Search
CPC ....... H03F 2200/477; H04B 1/04; H04B 1/16; H04B 1/40; H04W 52/52
See application file for complete search history.

(56) References Cited

U.S. PATENT DOCUMENTS

| | | | |
|---|---|---|---|
| 6,917,246 | B2 | 7/2005 | Thompson |
| 8,063,705 | B1* | 11/2011 | Kobayashi .............. H03F 3/087 |
| | | | 330/308 |
| 11,398,798 | B2 | 7/2022 | Korba et al. |
| 2005/0212602 | A1 | 9/2005 | Krvavac et al. |
| 2008/0143444 | A1 | 6/2008 | Liu et al. |
| 2011/0140775 | A1* | 6/2011 | Hong ...................... H03F 3/602 |
| | | | 330/124 R |
| 2012/0235734 | A1* | 9/2012 | Pengelly .................. H03F 3/68 |
| | | | 330/124 D |
| 2016/0164473 | A1* | 6/2016 | Li ......................... H03F 1/0288 |
| | | | 330/124 R |
| 2017/0222608 | A1* | 8/2017 | Kim ........................ H03F 3/245 |
| 2019/0149099 | A1* | 5/2019 | Lehtola ..................... H03F 3/24 |
| | | | 330/124 R |
| 2020/0358405 | A1 | 11/2020 | Tanaka et al. |
| 2021/0036661 | A1 | 2/2021 | Lehtola |
| 2021/0099136 | A1* | 4/2021 | Drogi ..................... H03F 3/245 |

OTHER PUBLICATIONS

Extended European Search Report for European Patent Application No. 23160826.6, mailed Aug. 8, 2023, 11 pages.

* cited by examiner

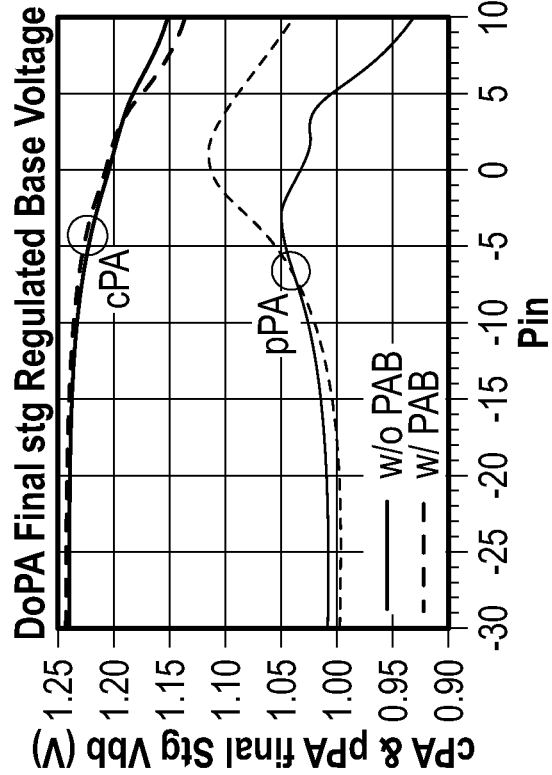
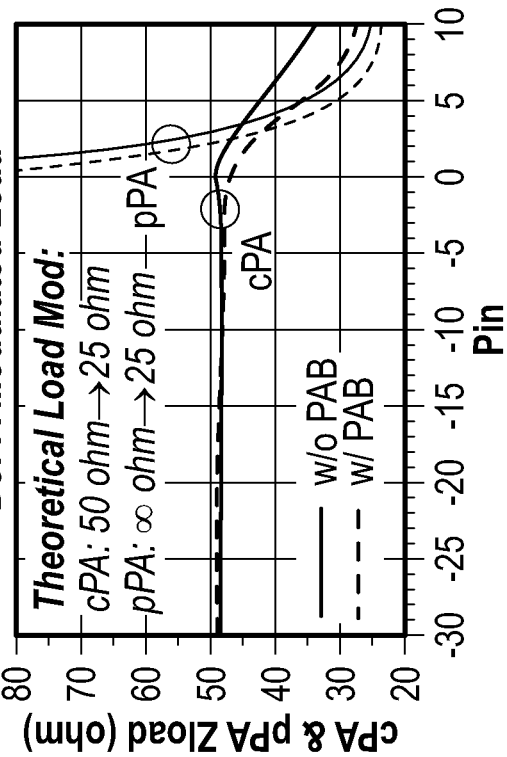
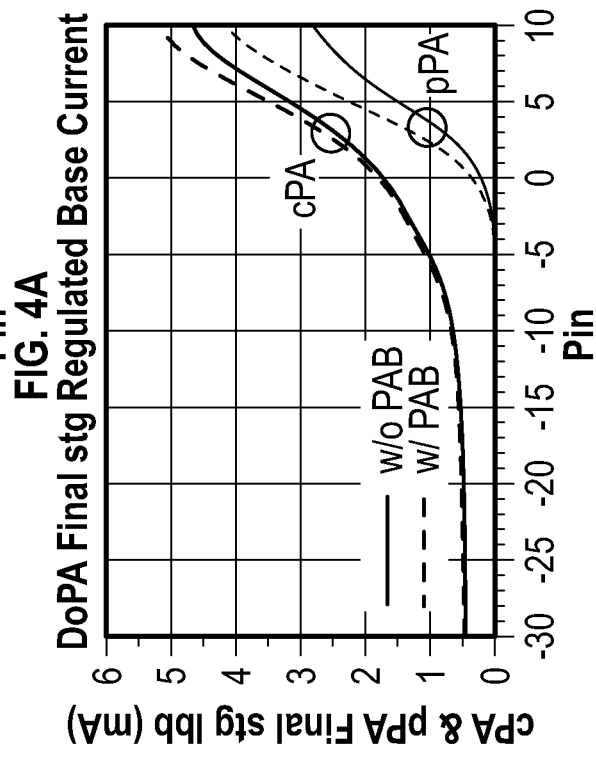
FIG. 4A
FIG. 4B
FIG. 4C
FIG. 4D

AMAM

DOHERTY POWER AMPLIFIER

RELATED APPLICATIONS

This application claims the benefit of provisional patent application U.S. Ser. No. 63/318,504, filed Mar. 10, 2022, the disclosure of which is hereby incorporated herein by reference in its entirety.

FIELD OF THE DISCLOSURE

The present disclosure relates to amplifier structures for maximizing linear power and power backoff efficiency.

BACKGROUND

A traditional bipolar junction transistor (BJT)—based Doherty power amplifier with the peaking amplifier (pPA) biased in class C cannot pull its base bias voltage up significantly in the peak power range purely based on radio frequency (RF) self-regulation. As a result, the BJT-based Doherty amplifier shows reduced P1 dB (output power at 1 dB compression) power compared with a conventional differential power amplifier at the same equivalent load line, due to insufficient pPA gain, insufficient pPA output power, and hence weak load modulation. Although the power loss can be recovered by raising the bias to move the traditional Doherty pPA into class B or class AB instead class C, the bias raise comes at a noticeable cost of power backoff (PBO) efficiency loss. Simply put, practical Doherty power amplifier design needs to trade off peak output power vs. PBO efficiency when pPA has a traditional fixed bias.

Various approaches using on die or off die power detector approaches have generally failed to adequately reduce performance tradeoffs. In addition to the added power detector, previous approaches have also needed some envelope shaping circuits to optimize the bias control profile. To integrate the reported approaches on die with the power amplifier die without degrading RF performance is challenging. Furthermore, power detectors often require long resistor-capacitor (RC) time constants, which are not appropriate for modern day signals with 100 MHz or higher RF bandwidth. As such, a new Doherty amplifier structure is needed to improve peak output power vs. PBO efficiency.

SUMMARY

Disclosed is an amplifier having a carrier amplifier configured as a common-emitter carrier power stage and a peaking amplifier configured as a common-emitter peaking power stage. Further included is power adaptive biasing circuitry coupled between the carrier amplifier and the peaking amplifier, wherein the power adaptive biasing circuitry is configured to sense direct current base voltages of the common-emitter carrier power stage and to generate control currents that debias the common-emitter carrier power stage in response to the current base voltages of the common-emitter carrier power stage.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

A conventional differential power amplifier is indicated by the thin short dashed lines. Fc=2593 MHz, Vcc=5 V.

FIGS. 2E to 2H are plots showing a differential Doherty power amplifier with PAB vs. without PAB, pPA biased in deep class AB. A conventional differential power amplifier is indicated by the thin short dashed lines. Fc=2593 MHz, Vcc=5 V.

Figure 3:
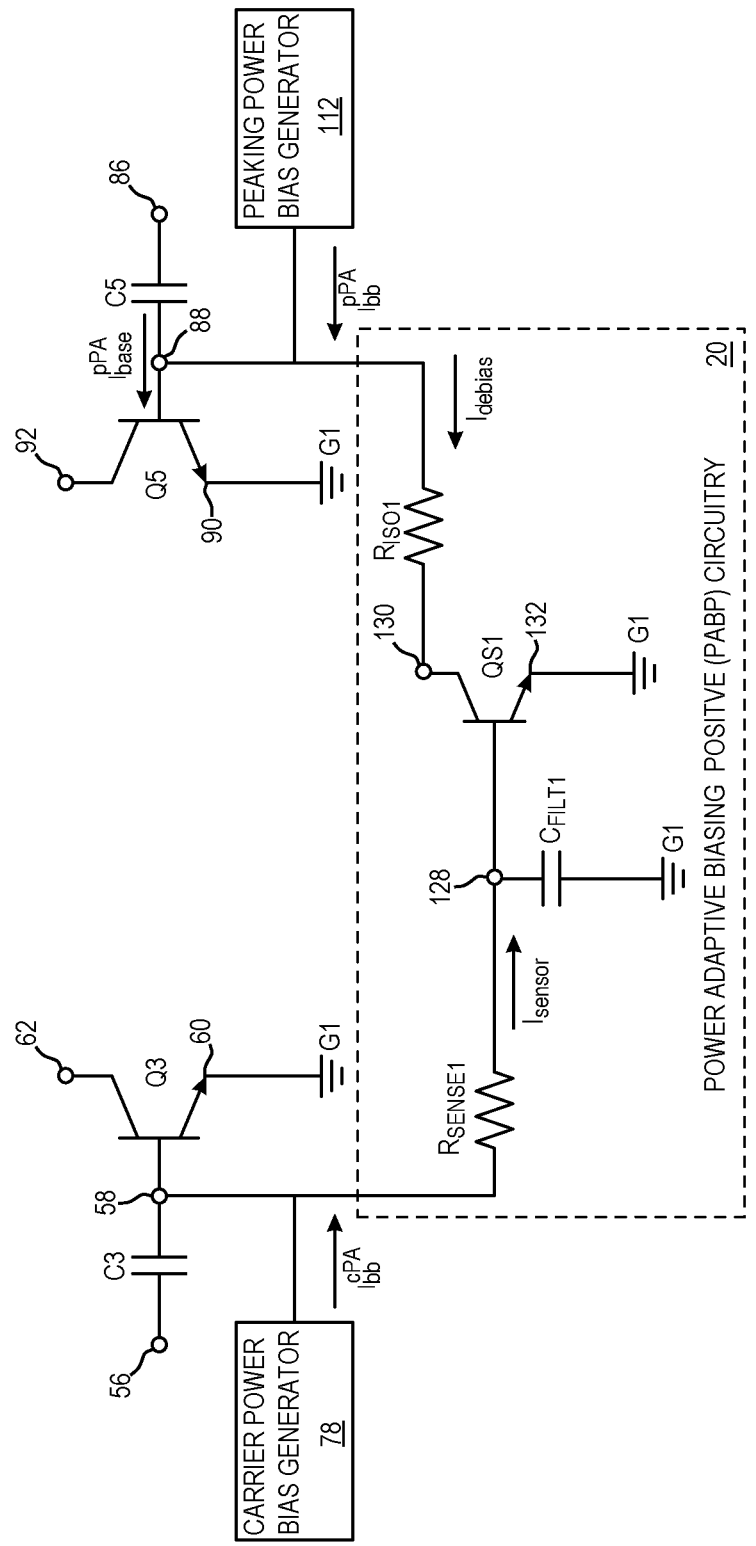

FIG. 3 is a schematic showing an embodiment of a simplified common-emitter bipolar junction transistor (BJT) device of automatic power adaptive biasing of the pPA.

FIG. 4A shows PAB sense and Idebias.

FIG. 4B shows Doherty power amplifier final stage regulated base direct current voltage.

FIG. 4C shows a Doherty power amplifier final stage regulated base direct current bias current.

FIG. 4D shows a Doherty power amplifier final stage load line.

Figure 5:
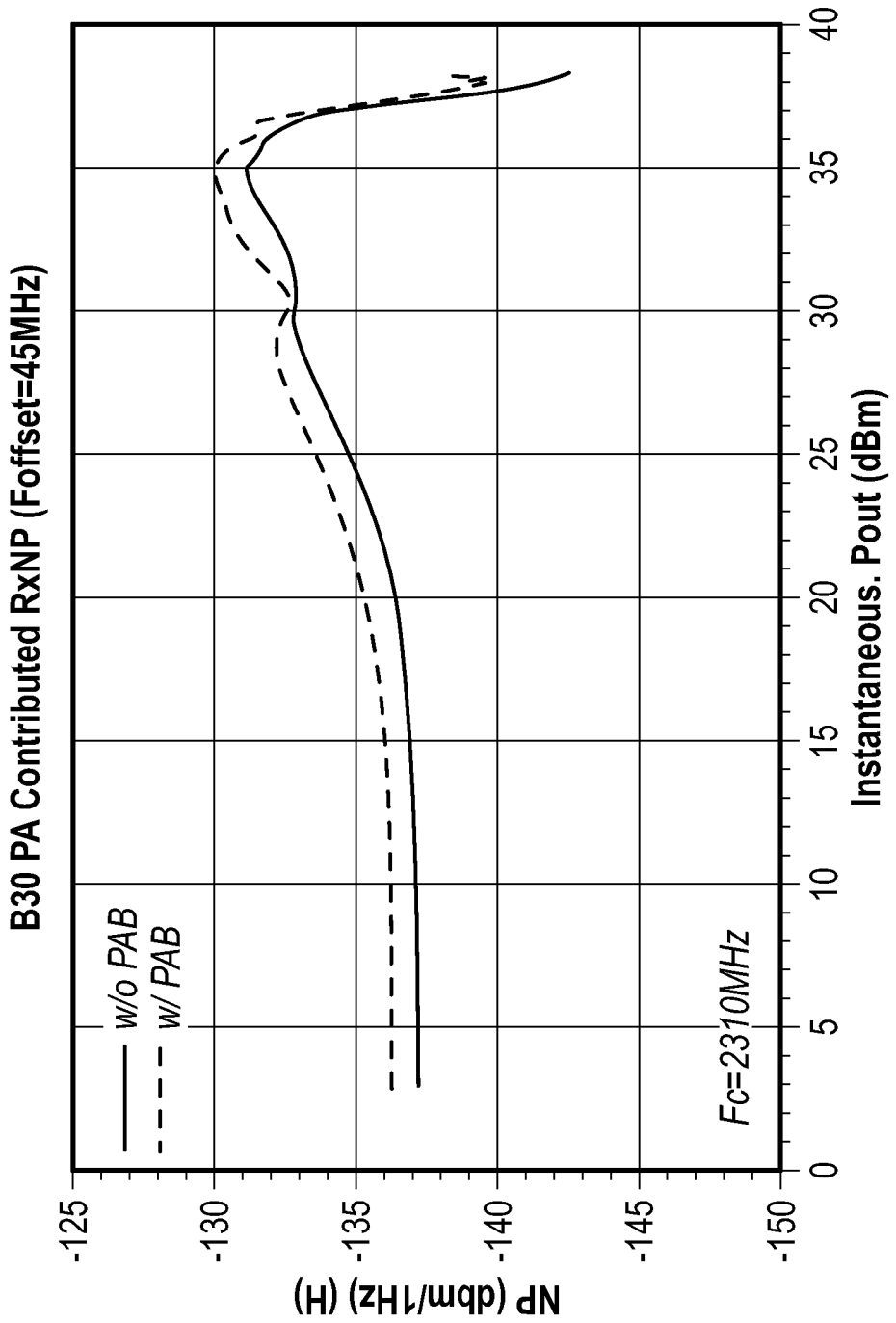

FIG. 5 is a plot showing a Doherty power amplifier—only RxNP at B30, Vcc=5 V.

Figure 6A:
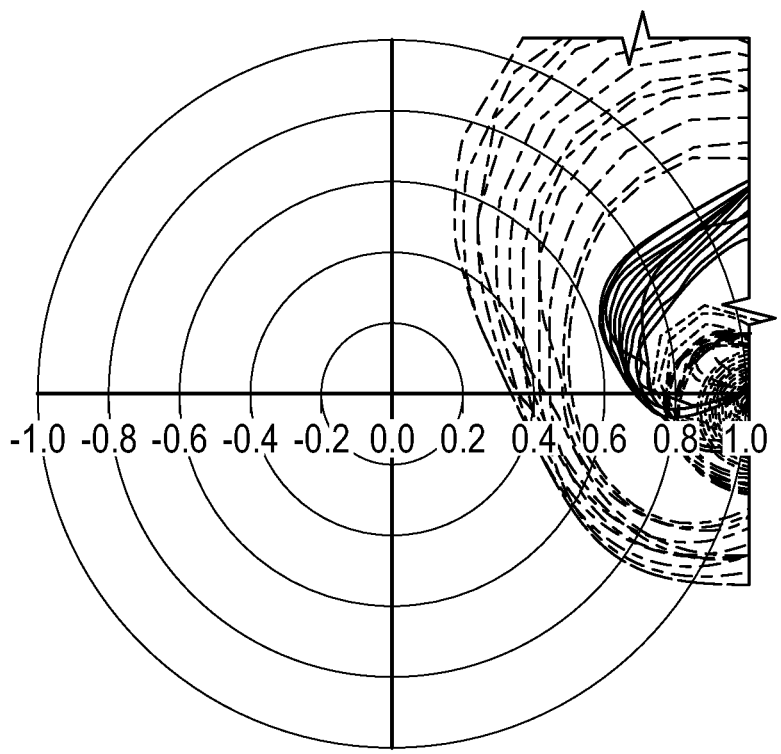
Figure 6B:
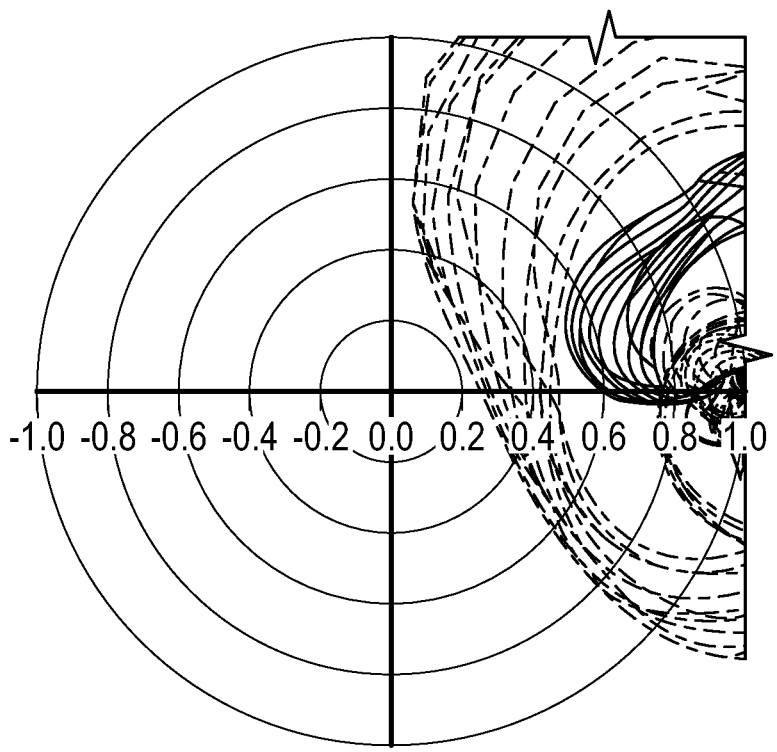

FIGS. 6A and 6B show a return difference simulated with Keysight ADS Winslow Stability Probe (Pin=−5 dBm, T=25° C., VSWR=6:1, Fc=2593 MHz, Vcc=5 V).

Figure 7A:
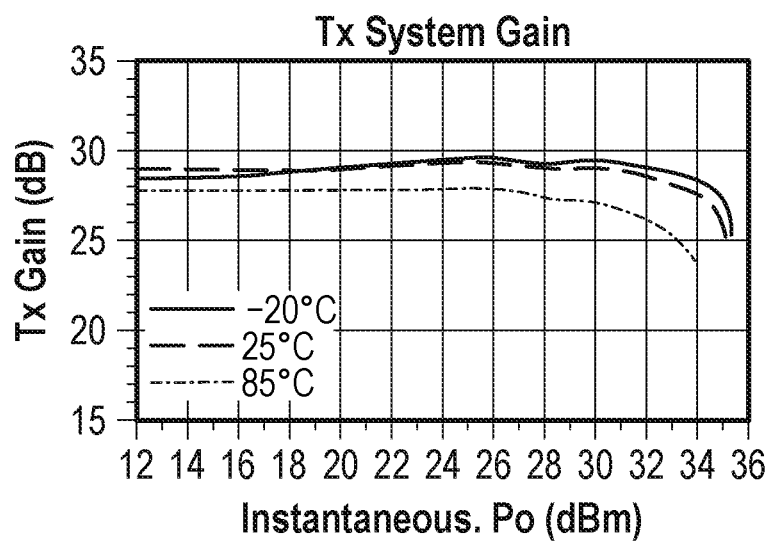
Figure 7B:
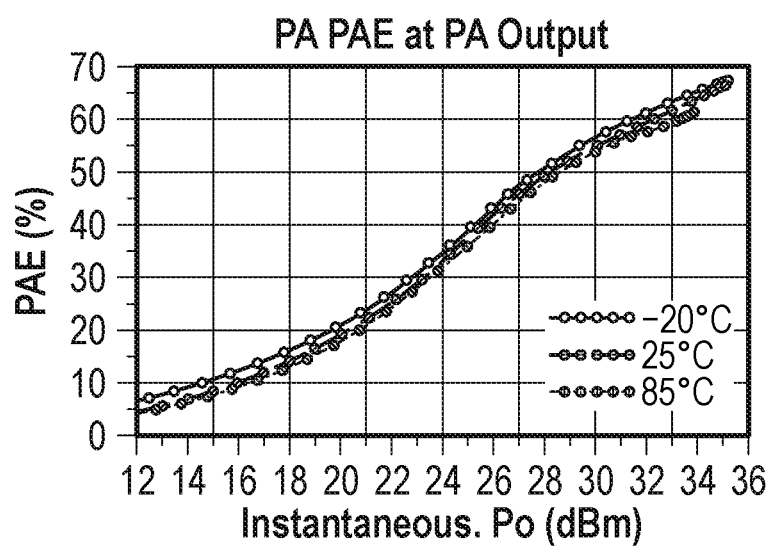

FIGS. 7A and 7B are plots showing power adaptively biased Doherty power amplifier performance over temperature. Fc=2593 MHz, Vcc=5 V.

Figure 8:
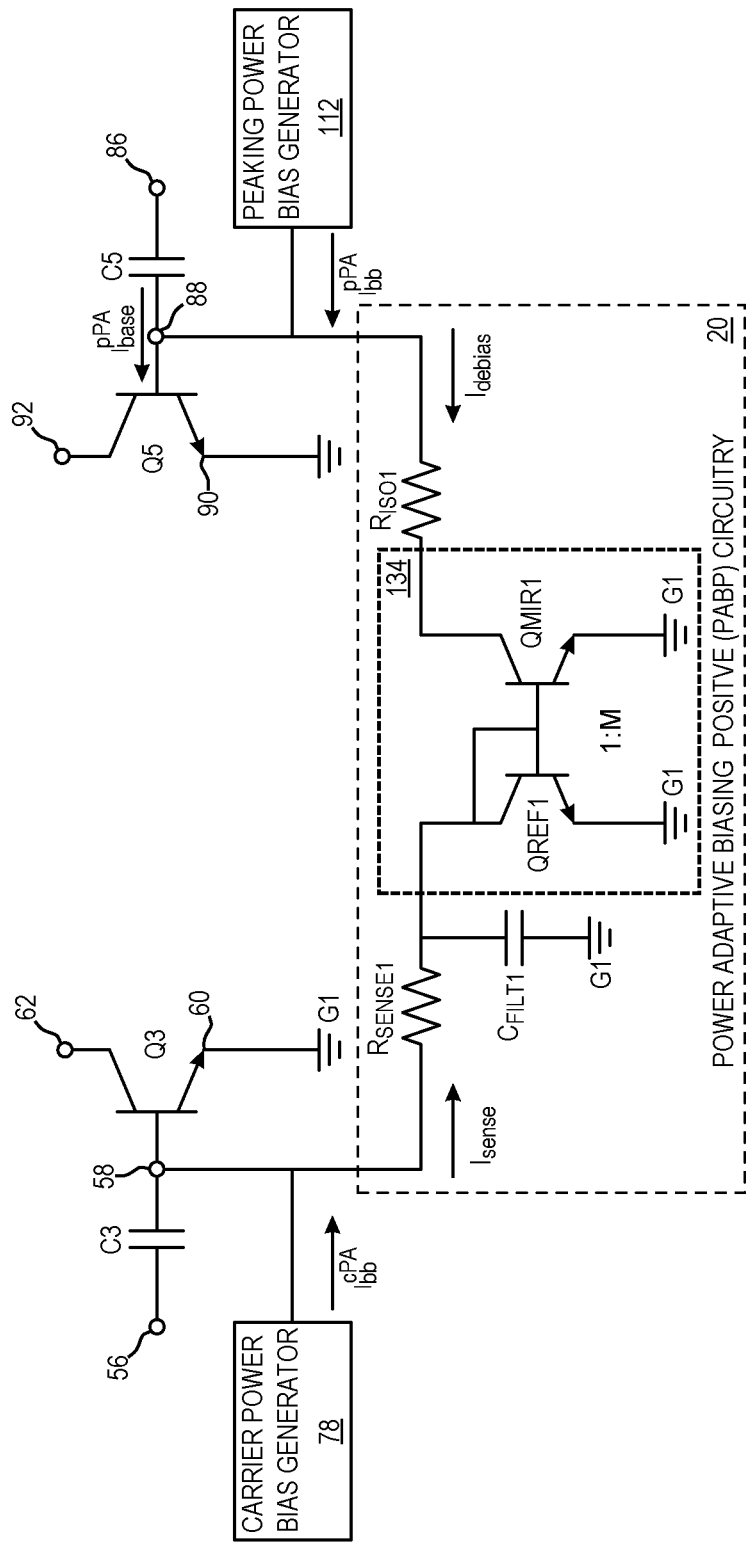
Figure 9A:
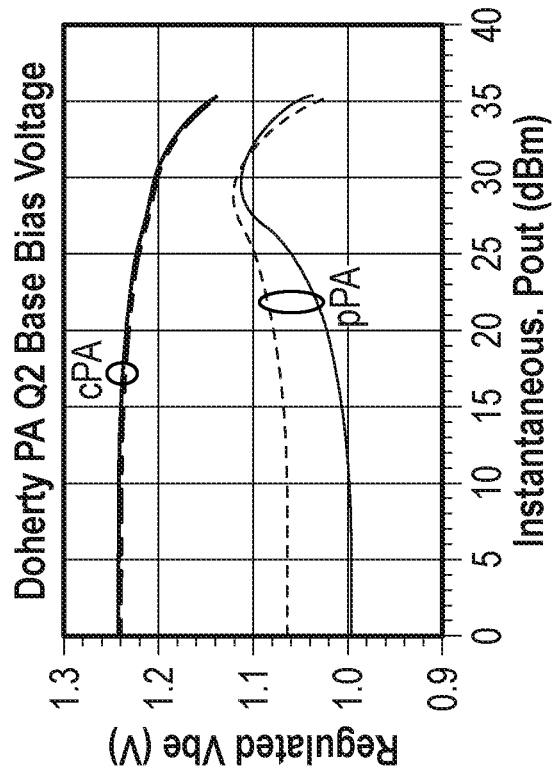
Figure 9B:
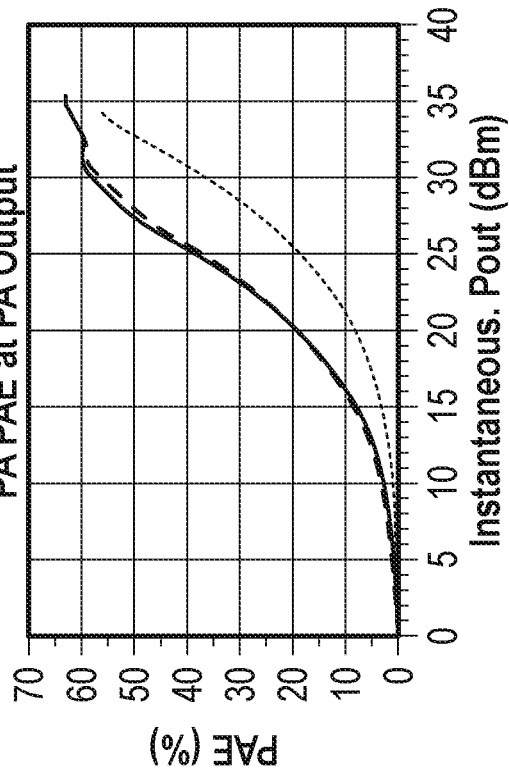
Figure 9C:
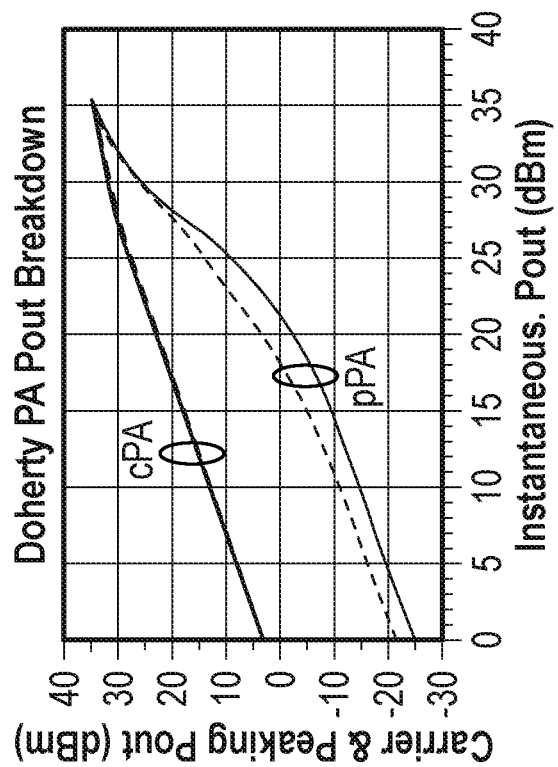
Figure 9D:
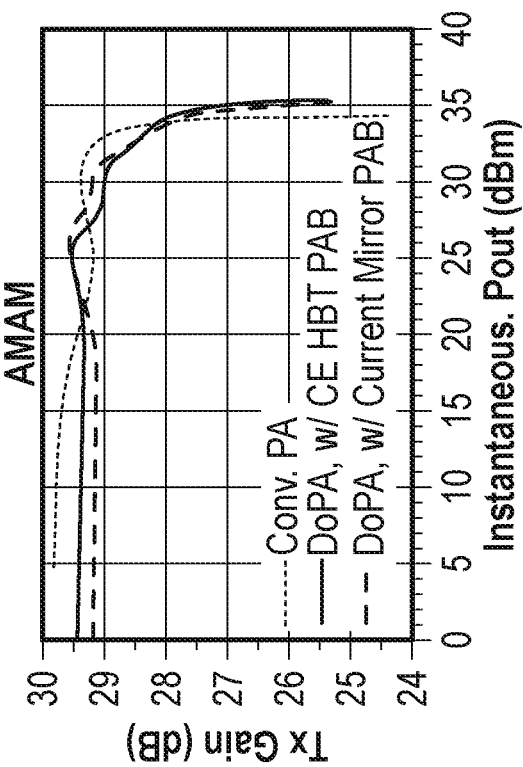

FIG. 8 is a schematic showing an embodiment of a simplified BJT current mirror of automatic power adaptive biasing of pPA.

FIGS. 9A to 9D are plots showing two embodiments with a PAB showing similar continuous wave radio frequency performances, although bias conditions are slightly different at backed off power. Fc=2593 MHz, Vcc=5 V.

Figure 10:
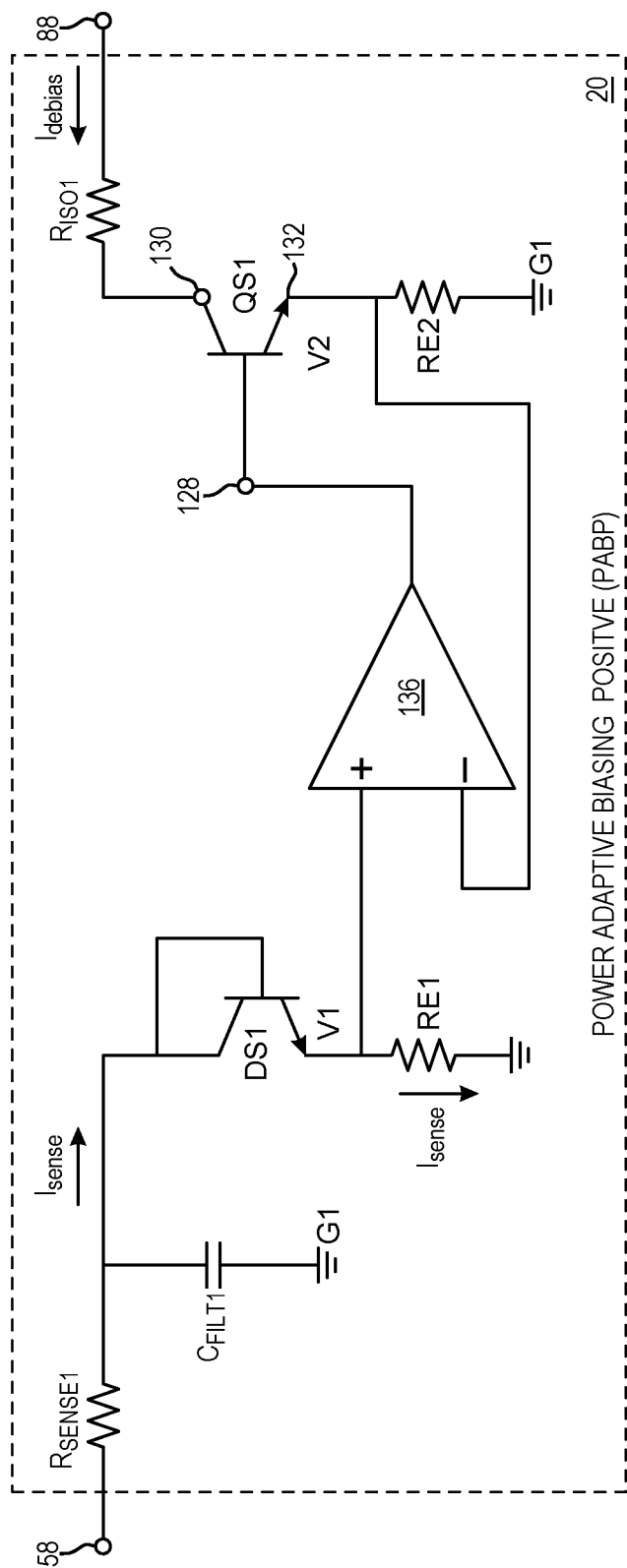

FIG. 10 is a schematic showing an operational amplifier—assisted embodiment of automatic power adaptive biasing.

Figure 11:
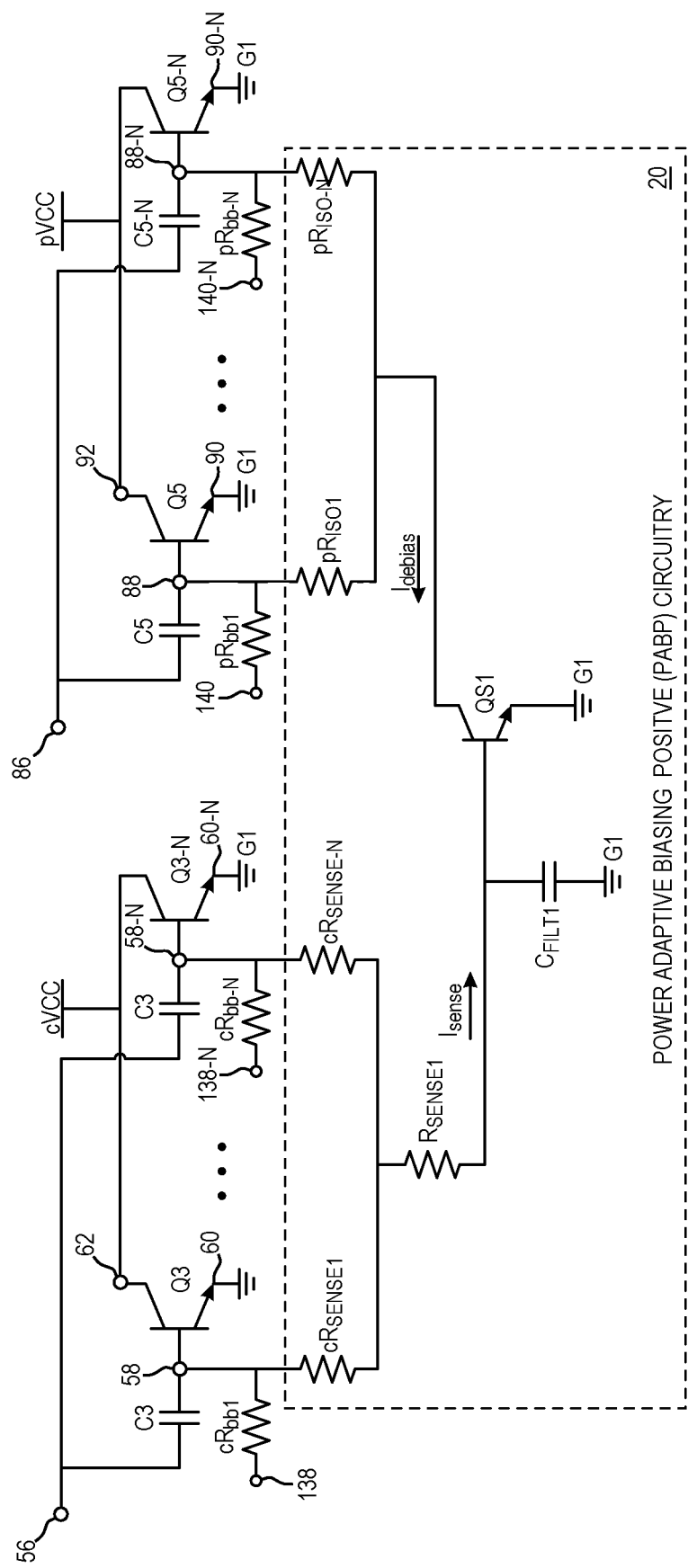

FIG. 11 is a schematic showing an embodiment with a resistor distributed common-emitter BJT of automatic power adaptive biasing of pPA.

Figure 12:
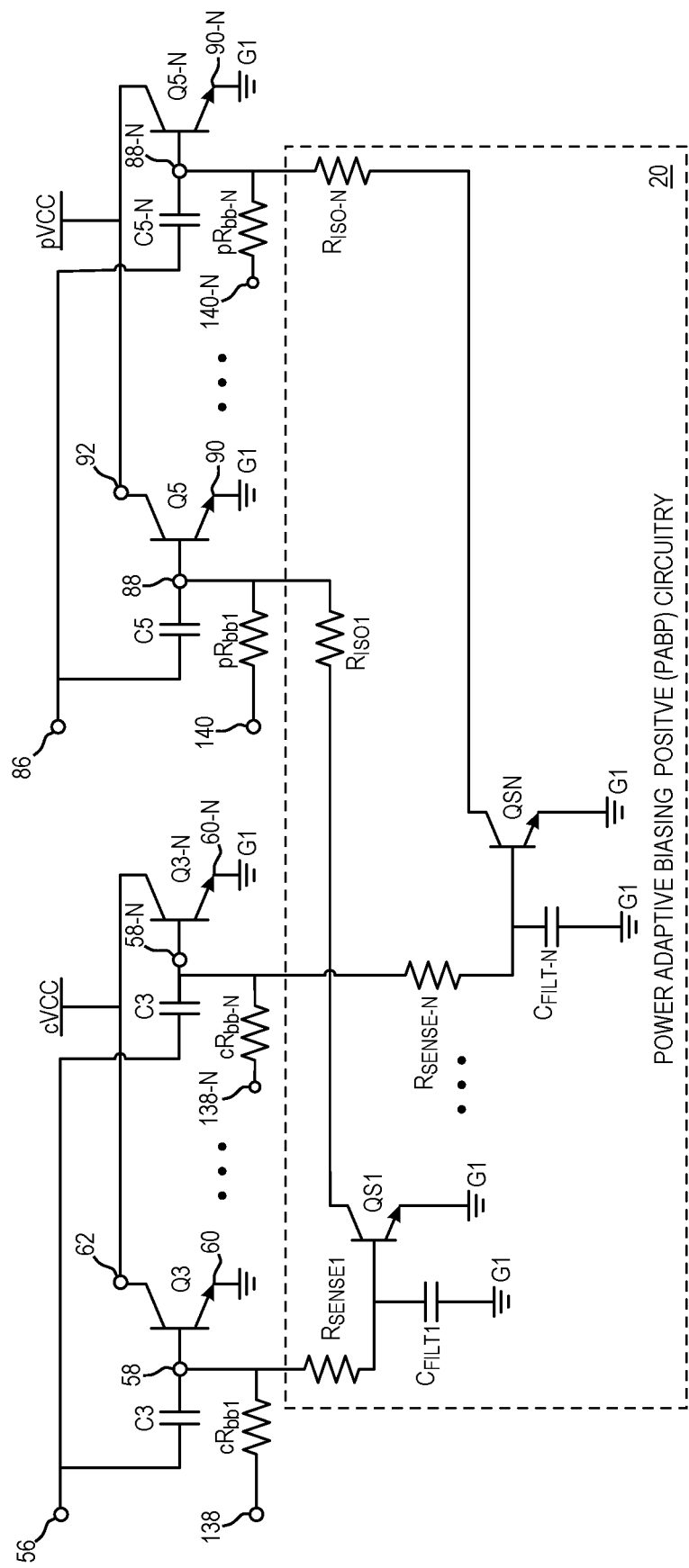

FIG. 12 is a schematic showing an embodiment with a fully distributed common-emitter BJT of automatic power adaptive biasing of pPA.

Figure 13:
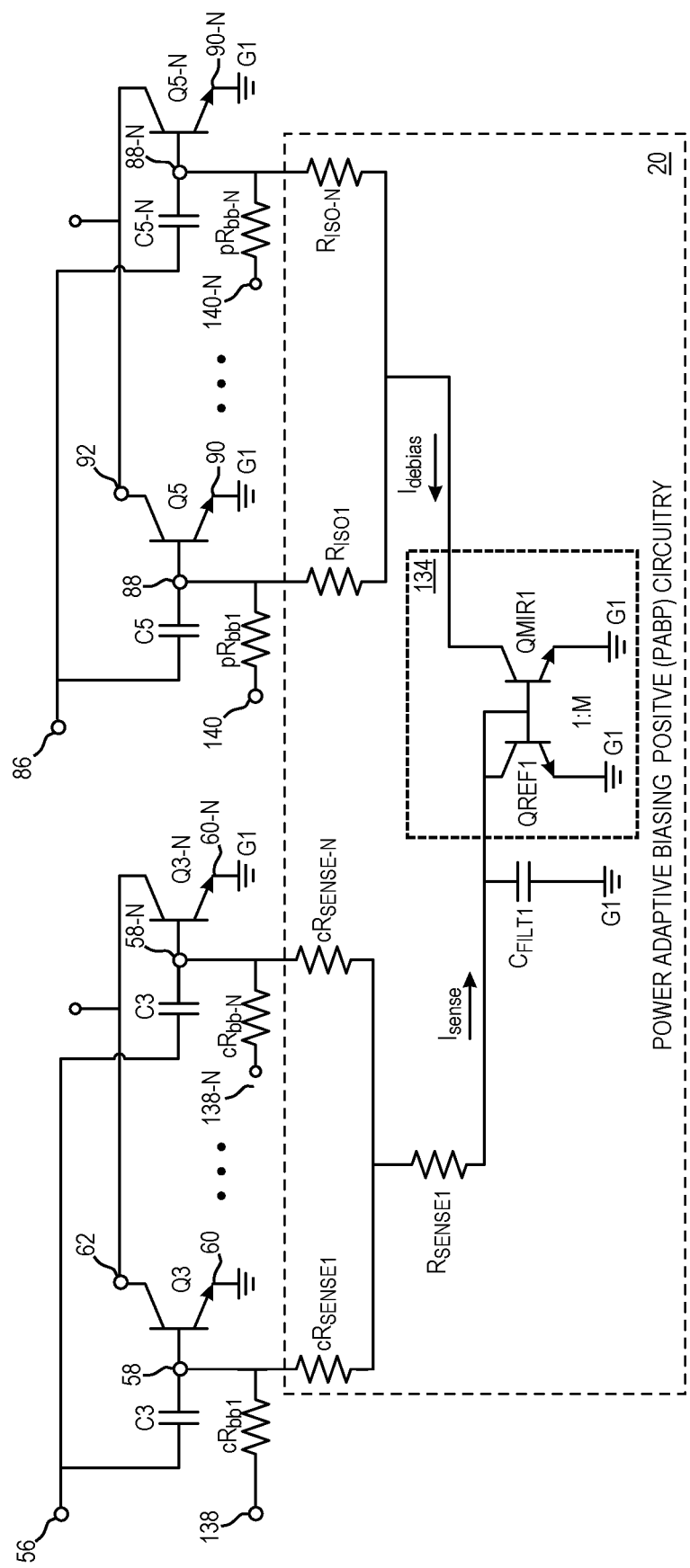

FIG. 13 is a schematic showing an embodiment with a distributed current mirror of automatic power adaptive biasing of pPA without distributing Qmir.

Figure 14:
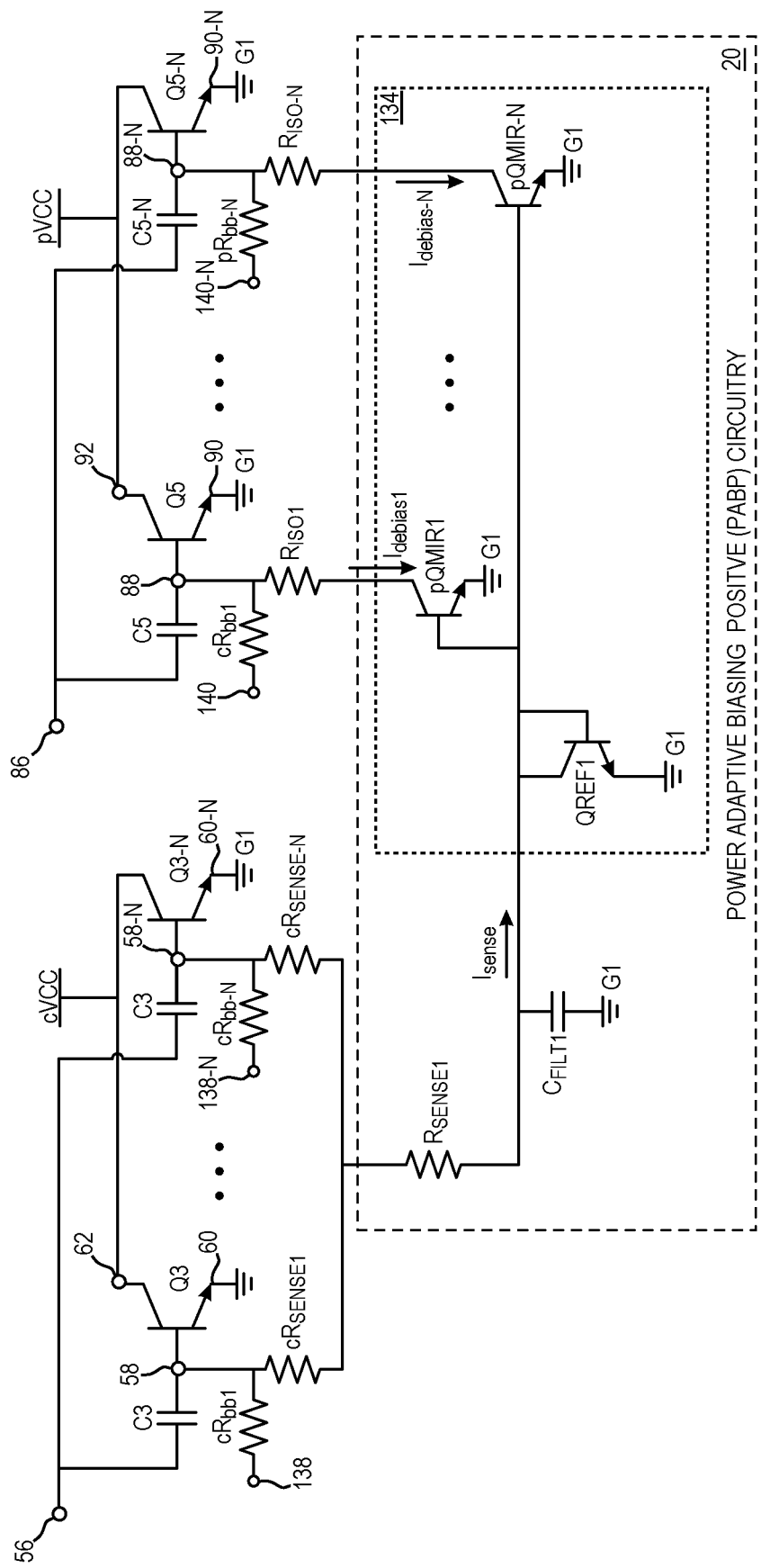

FIG. 14 is a schematic showing an embodiment with a distributed current mirror of automatic power adaptive biasing of pPA with distributed Qmir.

Figure 15:
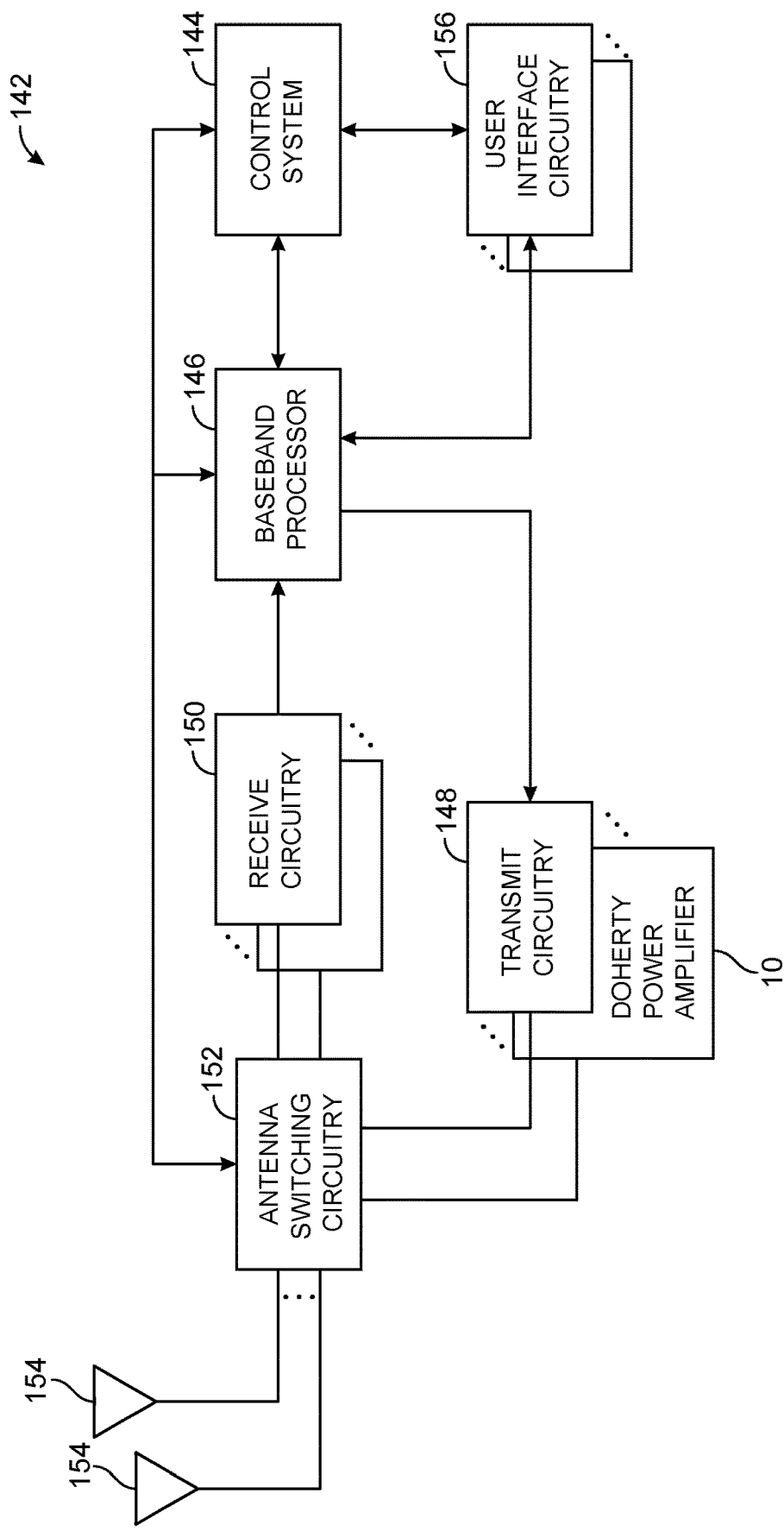

FIG. 15 is a schematic showing how the disclosed amplifier may interact with user elements such as wireless communication devices.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to an automatic power adaptive biasing (PAB) circuitry and method for a bipolar junction transistor-based Doherty power amplifier. The adaptive PAB circuitry and method are based on sensing the carrier amplifier (cPA) direct current base voltage that is already regulated from radio frequency and is inversely proportional to the signal baseband envelope. Embodiments comprise transconductive circuits to derive and scale a control current that follows the signal baseband envelope. This control current is then used to debias the peaking amplifier (pPA) into deep class C operation at a low to mid dynamic power region, thereby minimizing Doherty power amplifier current draw at power backoff (PBO). At the peak power region operation, the automatic PAB circuitry raises the pPA bias up to shallow class C or even class AB to boost both pPA output power and cPA output power through stronger load modulation. The automatic PAB circuitry and method according to the present disclosure allows the same Doherty power amplifier design to achieve both highest PBO efficiency and maximum linear output power by engineering the pPA ramp-up rate. Another important benefit is the elimination of the need for a capacitor with large capacitance that is required for the traditional power detector-based approach, and thus, the Doherty power amplifier reacts to envelope tracking much faster. A present time constant the Doherty power amplifier reaction is <1 nanosecond, whereas a 24 nanosecond delay may be typical for a traditional Doherty amplifier reaction time. In addition, embodiments according to the present disclosure are tightly integrated into the Doherty power amplifier and thus track the Doherty power amplifier temperature closely.

Figure 1:
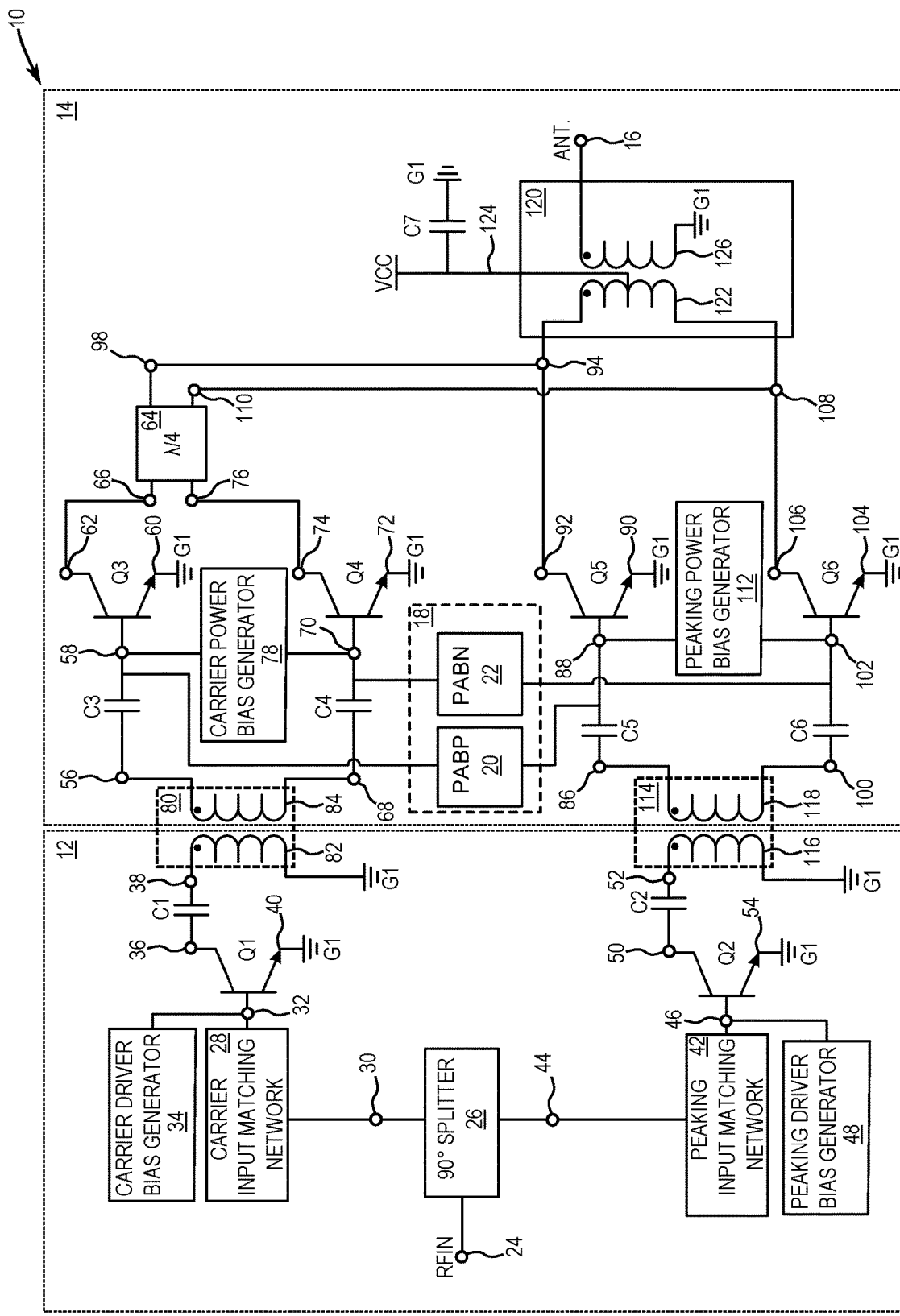
FIG. 1 is a schematic showing a differential Doherty power amplifier architecture in demonstration of power adaptive biasing (PAB) in the dashed line box.
Figure 2A:
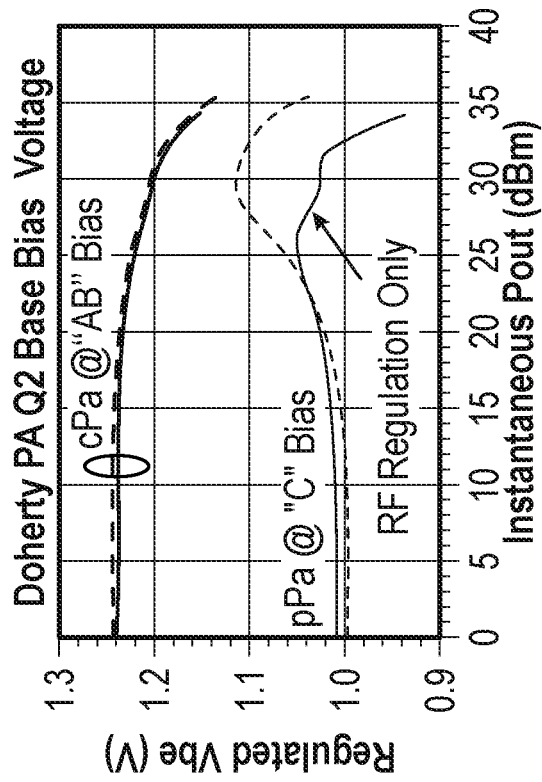
FIGS. 2A to 2D are plots showing a differential Doherty power amplifier with PAB versus without PAB, with the peaking amplifier (pPA) biased in class C.
Figure 2B:
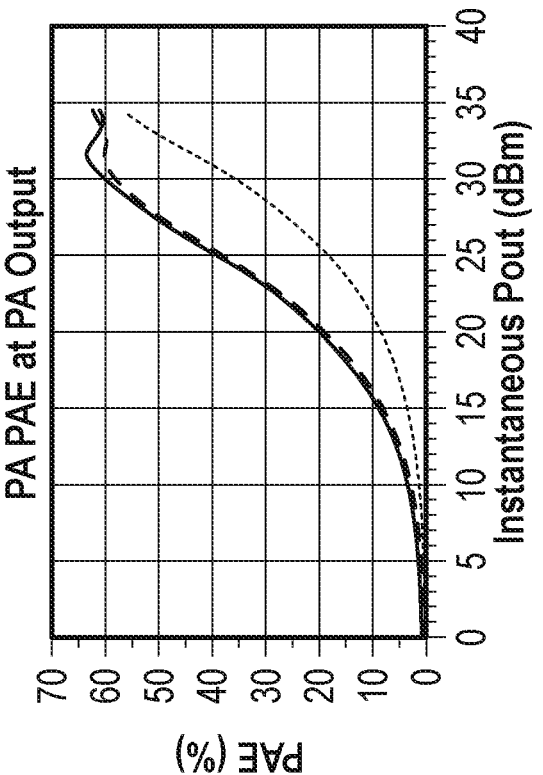
Figure 2C:
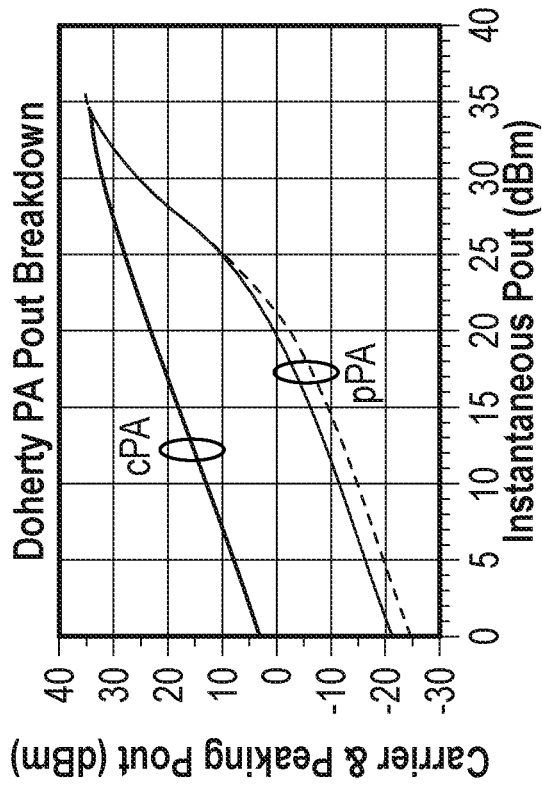
Figure 2D:
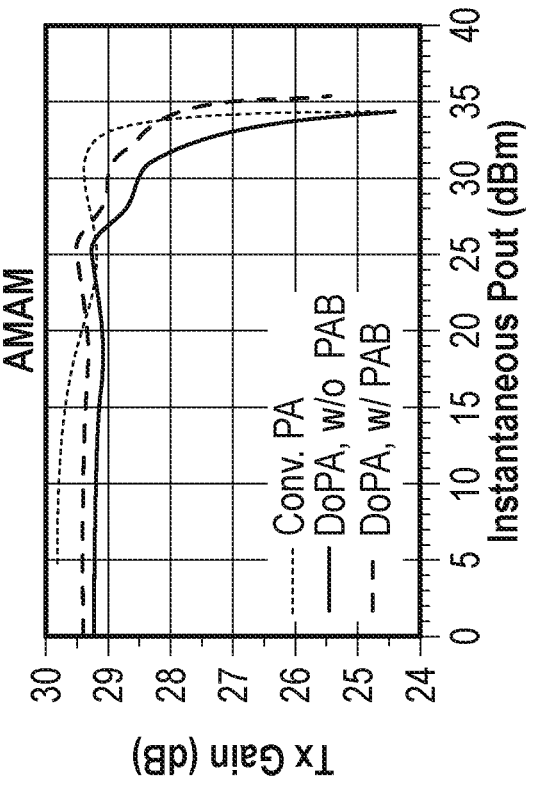
Figure 2F:
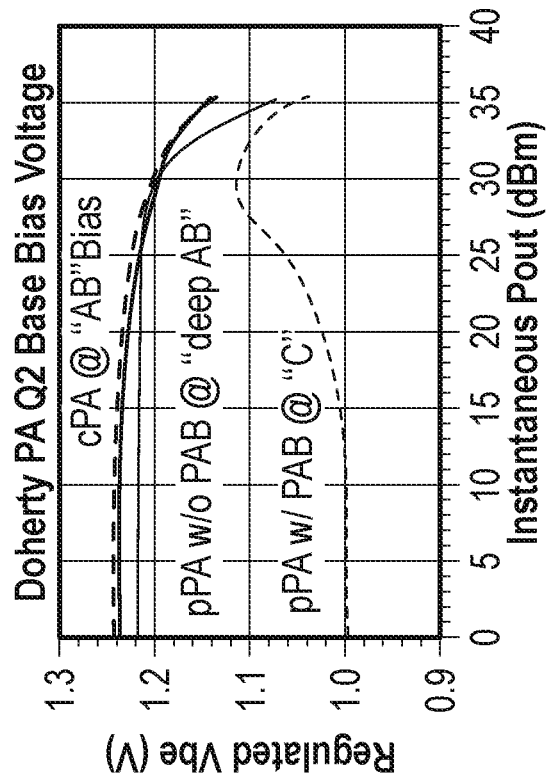
Figure 2H:
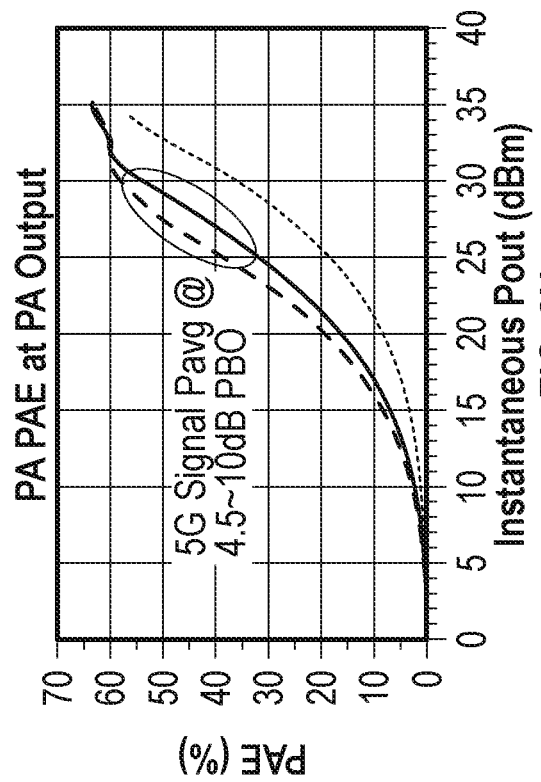
Figure 2E:
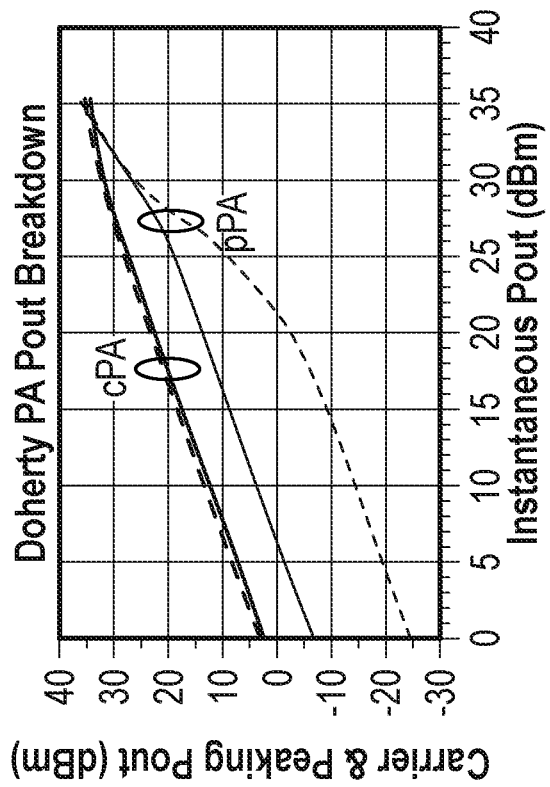
Figure 2G:
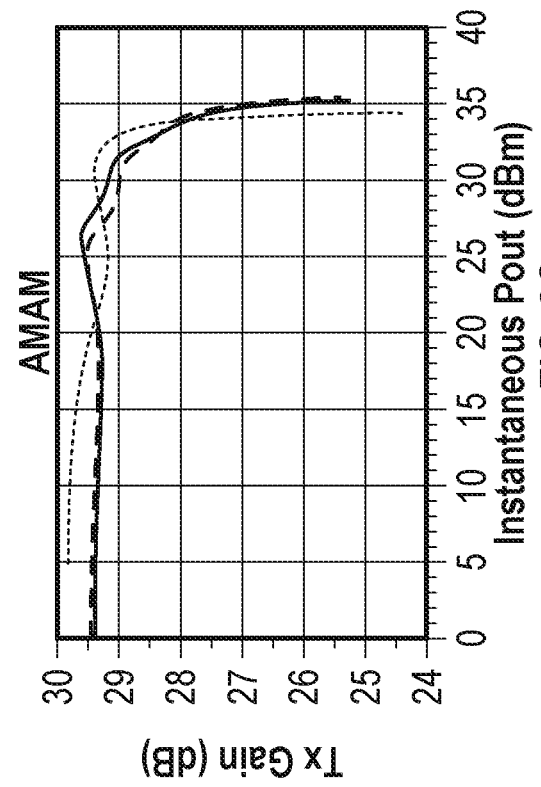

FIG. 1 is a schematic depicting a differential Doherty power amplifier that is structured in accordance with the present disclosure. The Doherty power amplifier 10 is designed for a 5G handset transmit (TX) system in the n40 and n41 bands using a gallium arsenide (GaAs) heterojunction bipolar transistor (HBT) process. The Doherty power amplifier 10 has two stages of power amplification with a first stage 12 being single-ended and a second stage 14 being differential-ended. A specified continuous wave 1-dB gain compression power target is 33.5 dBm at an antenna port 16 labeled ANT. Power adaptive biasing (PAB) circuitry 18, shown as power adaptive biasing positive (PABP) circuitry 20 and power adaptive biasing negative (PABN) circuitry 22 in FIG. 1, are added without changing the power amplifier cell traditional bias networks in accordance with the present disclosure.

The first stage 12 has a radio frequency (RF) signal input 24 labeled RFIN. A 90° splitter 26 is configured to direct a first portion of an RF signal arriving at the RF signal input 24 into a carrier signal path and direct a second portion of the RF signal into a peaking signal path. The carrier signal path includes a carrier driver transistor Q1 and a carrier input matching network 28 coupled between a carrier splitter output 30 of the 90° splitter 26 and a first driver base 32 of the carrier driver transistor Q1. A carrier driver bias generator 34 coupled to the first driver base 32 is configured to provide a substantially fixed bias for the carrier driver transistor Q1. A first coupling capacitor C1 is coupled between a first driver collector 36 of the carrier driver transistor Q1 and a first driver output 38. A first driver emitter 40 of the carrier driver transistor Q1 is coupled to a fixed voltage node G1, which in this exemplary embodiment is ground. The peaking signal path includes a peaking driver transistor Q2 and a peaking input matching network 42 coupled between a peaking splitter output 44 of the 90° splitter 26 and a second driver base 46 of the peaking driver transistor Q2. A peaking driver bias generator 48 coupled to the second driver base 46 is configured to provide a substantially fixed bias for the second driver transistor Q2. A second coupling capacitor C2 is coupled between a second driver collector 50 of the peaking driver transistor Q2 and a second driver output 52. A second driver emitter 54 of the peaking driver transistor Q2 is coupled to the fixed voltage node G1.

The second stage 14 includes a first carrier power transistor Q3 that is configured to amplify positive portions of the RF signal taking the carrier path. A third coupling capacitor C3 is coupled between a positive carrier input 56 and a positive carrier base 58. A positive carrier emitter 60 of the first carrier power transistor Q3 is coupled to the fixed voltage node G1. A positive carrier collector 62 is coupled to a quarter-wave transformer 64 by way of a first quarter-wave input 66. The second stage 14 further includes a second carrier power transistor Q4 that is configured to amplify negative portions of the RF signal taking the carrier path. A fourth coupling capacitor C4 is coupled between a negative carrier input 68 and a negative carrier base 70 of the second carrier power transistor Q4. A negative carrier emitter 72 is coupled to the fixed voltage node G1. A negative carrier collector 74 is coupled to the quarter-wave transformer 64 by way of a second quarter-wave input 76. A carrier power bias generator 78 is coupled between the positive carrier base 58 and the negative carrier base 70. The carrier bias generator 78 is configured to provide substantially fixed bias to both the first carrier power transistor Q3 and the second carrier power transistor Q4. A carrier signal transformer 80 is coupled within the carrier signal path between the first stage 12 and the second stage 14. The carrier signal transformer 80 has a primary coil 82 coupled between the first driver output 38 and the fixed voltage node G1. The carrier signal transformer 80 has a secondary coil 84 coupled between the positive carrier input 56 and the negative carrier input 68.

The second stage 14 further includes a first peaking power transistor Q5 that is configured to amplify positive portions of the RF signal taking the peaking path. A fifth coupling capacitor C5 is coupled between a positive peaking input 86 and a positive peaking base 88. A positive peaking emitter 90 of the first peaking power transistor Q5 is coupled to the fixed voltage node G1. A positive peaking collector 92 is coupled to a positive output 94 that is further coupled to a first quarter-wave output 98 of the quarter-wave transformer 64. Amplified signals from the positive carrier transistor Q3 and the positive peaking transistor Q5 are summed together at the positive output 94.

The second stage 14 further includes a second peaking power transistor Q6 that is configured to amplify negative portions of the RF signal taking the peaking path. A sixth coupling capacitor C6 is coupled between a negative peaking input 100 and a negative peaking base 102 of the second peaking power transistor Q6. A negative peaking emitter 104 is coupled to the fixed voltage node G1. A negative peaking collector 106 is coupled to a negative output 108 that is further coupled to a second quarter-wave output 110. Amplified signals from the positive peaking transistor Q5 and the negative peaking transistor Q6 are summed together at the negative output 108.

A peaking power bias generator 112 is coupled between the positive peaking base 88 and the negative peaking base 102. The peaking power bias generator 112 is configured to provide substantially fixed bias to both the first peaking power transistor Q5 and the second peaking power transistor Q6. A peaking signal transformer 114 is coupled within the peaking signal path between the first stage 12 and the second stage 14. The peaking signal transformer 114 has a primary coil 116 coupled between the second driver output 52 and the fixed voltage node G1. The peaking signal transformer 114 has a secondary coil 118 coupled between the positive peaking input 86 and the negative peaking input 100. A balanced-unbalanced transformer (Balun) 120 has a balanced side coil 122 coupled between the positive output 94 and the negative output 108. The balanced side coil 122 has a supply tap 124 that is coupled to a supply voltage source VCC that supplies power to the positive carrier transistor Q3, the negative carrier transistor Q4, the positive peaking transistor Q5, and the negative peaking transistor Q6. A bypass capacitor C7 is coupled between the supply tap 124 and the fixed voltage node G1. An unbalanced side coil 126 is coupled between the antenna port 16 and the fixed voltage node G1.

In operation, the PABP circuitry 20 coupled between the positive carrier base 58 of the positive carrier transistor Q3 and the positive peaking base 88 of the positive peaking transistor Q5 is configured to sense direct current base voltage of the positive carrier transistor Q3 and to generate a first control current that debiases the positive peaking transistor Q5 in response to the direct current base voltage of the positive carrier transistor Q3. Moreover, the PABN circuitry 22 coupled between the negative carrier base 70 of the negative carrier transistor Q4 and the negative peaking base 102 of the negative peaking transistor Q6 is configured to sense direct current base voltage of the negative carrier transistor Q4 and to generate a second control current that debiases the negative peaking transistor Q6 in response to the direct current base voltage of the negative carrier transistor Q4.

FIGS. 2A to 2D and FIGS. 2E to 2H show the benefit of PAB (dashed line) compared with a traditional Doherty power amplifier (solid line) at two extreme pPA biasing schemes. In FIGS. 2A to 2D, the traditional Doherty power amplifier with the pPA biased in class C cannot pull its base bias voltage up significantly in the peak power range. As a result, it shows a ~2.5 dB P1 dB power loss compared with that of a conventional differential power amplifier (thin short dashed line) due to insufficient pPA power output and hence weaker load modulation. With the help of PAB, the Doherty power amplifier can recover P1 dB power at little cost of power back off (PBO) efficiency.

FIGS. 2E to 2H take a different approach from the traditional Doherty power amplifier biasing. The pPA is biased in deep class Aft instead of class C, boosting the pPA gain and overall output power. But this comes at the noticeable cost of PBO efficiency loss compared with the adaptively biased Doherty. Summarizing the FIGS. 2A to 2D and FIGS. 2E to 2H scenarios, although pPA biasing can be manipulated to maximize P1 dB or PBO efficiency, both are not possible. The PAB allows the Doherty power amplifier to achieve both in the same design. This is critical to meet modern day 4G/5G front-end module requirements of power and maximum efficiency due to the high loss of multiplexing many communication bands.

A key to automatic power adaptive biasing is finding a regulated direct current (DC) signal within the first stage 12 and the second stage 14 that is related to instantaneous RF power under modulated signal drive. For bipolar-based power amplifiers, the regulated base voltage is inversely proportional to this RF power, as illustrated by the carrier power amplifier (cPA) regulated Vbe plots in FIG. 2B and FIG. 2F. When RF power is incident on the base-emitter diode of a transistor, the diode DC bias current increases but the DC bias voltage decreases as RF power increases, due to the exponential I/V curve of the diode. By sensing this base-emitter voltage, circuits in accordance with the present disclosure can be built to generate a current that is subtracted from the pPA bias circuits in the lower power region. In the higher power region, the current subtraction reduces or stops, which effectively pulls up pPA bias. This speeds up pPA ramp up rate over power drive without sacrificing the pPA current draw or overall efficiency at PBO.

A bias adaptation method based on sensing power amplifier base voltage and scaling control current with a common-emitter mode bipolar device, as shown in FIG. 3, is applied to a differential-ended version of the Doherty power amplifier 10 that is fabricated in a silicon (Si), GaAs, silicon germanium (SiGe), or indium phosphide (InP) bipolar junction transistor fabrication process. Transistors making up the Doherty amplifier 10 can be n-type metal oxide semiconductor (NMOS) devices in a bipolar complementary metal oxide semiconductor (BiCMOS) process. The transistors can also be n-type field-effect transistor (NFET) devices in a bipolar field-effect transistor (BiFET) process.

FIG. 3 is a schematic of an exemplary embodiment of a section of the Doherty power amplifier 10 according to the present disclosure. In particular, FIG. 3 depicts an exemplary embodiment of the PAPB circuitry 20 that has a sensor transistor QS1 having a sensor base 128, a sensor collector 130, and a sensor emitter 132. A sensing resistor RSENSE1 is coupled between the positive carrier base 58 and the sensor base 128. A filter capacitor CFILT1 is coupled between the sensor base 128 and the fixed voltage node G1. An isolation resistor $R_{ISO1}$ is coupled between the sensor collector 130 and the positive peaking base 88. The sensor emitter 132 is coupled to the fixed voltage node G1. In exemplary embodiments, the sensor transistor QS1 is a heterojunction bipolar transistor. While FIG. 3 depicts the PABP circuitry 20, the PABN circuitry 22 is structured the same with the sensing resistor RSENSE1 being coupled between the negative carrier base 70 and the sensor base 128. Also, in the PABN circuitry 22, the isolation resistor $R_{ISO1}$ is coupled between the sensor collector 130 and the negative peaking base 102. Equations (1), (2), and (3) govern the relationships between pPA base current and sensed cPA base voltage:

$$I_{base}^{pPA} = I_{bb}^{pPA} - I_{debias} \quad (1)$$

$$I_{debias} = \beta \cdot I_{sense} \quad (2)$$

$$I_{sense} \cdot R_{sense} + \frac{nKT}{q} \cdot \ln\left(\frac{I_{sense} \cdot \beta}{I_s^{Qs}}\right) = V_{base}^{cPA}, \quad (3)$$

where $\beta$ is the HBT device forward current gain (=105), q is the unit electron charge, n is the transistor ideality factor, K is the Boltzman constant, T is the device junction temperature, and $I_S^{Qs}$ is the common-emitter device saturation current for the sensor transistor QS1.

Note that Equation (3) is a transcendental function that prohibits a clean closed form of relationship of the two variables. The sensing resistor $R_{SENSE1}$ and the filter capacitor $C_{FILT1}$ make a low-pass filter to reject RF power injection into the sensor transistor QS1. This helps reduce RF noise and maintain stability as it significantly attenuates the RF gain through the PAB path. As designed, the low-pass filter time constant=$R_{SENSE1}$ (=600 ohm)*CFILT1 (=1 pF)=0.6 nS is found to be sufficient based on simulations. This extremely short delay time guarantees PAB will have sufficient speed to handle the 5G signal envelope bandwidth, which can be as large as 100 MHz in the n41 band. The isolation resistor $R_{ISO1}$ serves the purpose of isolating transistor QS1 from the pPA final stage at RF so that it does not accidentally detune the pPA base impedance. Depending on the operating frequency, the size of the sensing transistor QS1, and device technology, isolation resistor $R_{ISO1}$ may not be required.

To show the effect of PAB, FIG. 4A illustrates how the simulated current draw inside PAB decreases as input power drive increases. Idebias and Isense track each other with a scaling factor of B. FIG. 4B shows the second stage bias voltage of the Doherty power amplifier 10 with PAB shown in dashed line and without PAB shown in solid line. Due to adaptive biasing, the pPA regulated base voltage pulls up much faster than the traditional Doherty power amplifier without PAB in the high Pin drive region. FIG. 4C shows the second stage base bias currents (Ibb). As such, the pPA bias current (Ibb) pulls up much faster with the help of PAB. Also note that the cPA regulated bias current (Ibb) also increases. This is due to the higher cPA output power from stronger load modulation with PAB, as shown in FIG. 4D. In the low power region, the pPA is biased in class C in both Doherty power amplifiers. The Vbe turn-on threshold is approximately 1.2 V at Tambient=25° C. for GaAs HBTs used in the example implementation.

To address potential concerns about the impact of PAB on noise, power amplifier—only band 30 (B30) receive (RX) band noise power is simulated as the worst case due to its close TX-RX separation in frequency. FIG. 5 shows there is a slight degradation of RxNP with PAB; however, it is only 1 to 1.5 dB at the power amplifier output. With a slight multiplexer design improvement in rejection, B30 receive band noise power (RxNP) should be similar at the antenna port 16.

Transmit stability is also analyzed under continuous wave large signal drive over a voltage standing wave ratio (VSWR)=6:1 at the antenna. In FIGS. 6A and 6B, the input power Pin=−5 dBm was first found to be the worst value from an input power sweep with a load set to 50 ohm. Next, with Pin fixed at −5 dBm, the VSWR was set to 6:1 and the load phase angle was swept from 0 to 330 degrees in 30-degree steps at the antenna. The Winslow Stability Probe was placed at five different locations inside the Doherty power amplifier to analyze all the loops. The different separate curves in FIGS. 6A and 6B correspond to the results from each probe location. Both circuits meet the stability criteria by having no return difference traces encircling the origin of the plots. The PAB Doherty amplifier shows a slight degradation of stability margin. This is due to the higher intrinsic transistor device gain associated with higher bias current at peak drive region, as shown in FIG. 4C.

Temperature sweep performance of the adaptively biased Doherty power amplifier is presented in FIGS. 7A and 7B. Temperatures of −20° C., 25° C., and 85° C. are simulated using the ADS electrothermal simulator to check RF performance drift. As shown in FIG. 7B, the Doherty power amplifier gain and PAE behave very well over temperature. This is a result of using the simple power adaptive bias according to the present disclosure and laying it out such that it is very close to the cPA final stage on the same die. Due to the physical proximity, the common-emitter device tracks cPA final stage temperature closely.

A bias adaptation method based on sensing power amplifier base voltage and scaling control current with a current mirror, as shown in FIG. 8, is applied to a differential-ended Doherty power amplifier in a Si, GaAs, SiGe, or InP BJT process. The current mirror can be implemented with an NMOS pair in a BiCMOS process or an NFET pair in BiFET process.

FIG. 8 shows an alternative embodiment according to the present disclosure by employing a current mirror 134 that includes a reference transistor QREF1 and a mirror transistor QMIR1. The benefit of using the current mirror 134 is that designers can control the Idebias vs. Isense scaling ratio with emitter area ratio M, which gives more design flexibility to optimize the power amplifier performance. Equation (4) and transcendental Equation (5) govern the Idebias vs. cPA base voltage relationship:

$$I_{debias} = \frac{m\beta}{1+m+\beta} \cdot I_{sense} \quad (4)$$

$$I_{sense} \cdot R_{sense} + \frac{nKT}{q} \cdot \ln\left(\frac{I_{sense} \cdot \beta}{(1+m+\beta) \cdot I_S^{Qref}}\right) = V_{base}^{cPA}, \quad (5)$$

where $I_S^{Qref}$ is the reference diode saturation current, and m is the current mirror ratio=emitter area ratio.

FIGS. 9A to 9D show Doherty power amplifier performance for a common-emitter HBT embodiment vs. a current mirror embodiment (m=10.6) according to the present disclosure. Since the Idebias scaling factor mβ/(1+m+β) is lower than 13 in Equation (2), this embodiment shows a less steep pPA bias ramp-up rate. The low power region pPA bias difference is due to different biasing strategies to optimize each power amplifier performance. Overall, the Doherty power amplifier performance is similar between the two methods with slight power-added efficiency differences in the peak power region.

An operational amplifier—assisted embodiment of power adaptive biasing according to the present disclosure is shown in FIG. 10. An operational amplifier 136 drives the base of sensor transistor QS1 to equalize V1 and V2 (Equation 6) since it has an almost infinite voltage gain. A diode-connected transistor DS1 is coupled between the sensing resistor $R_{SENSE1}$ and a first emitter resistor RE1 that is coupled to the fixed voltage node G1. A positive input of the operational amplifier 136 is coupled to a node between the diode-connected transistor DS1 and the sensing resistor $R_{SENSE1}$. A first voltage V1 is sensed by the positive input. A second emitter resistor RE2 is coupled between the sensor emitter 132 of the sensor transistor QS1 and the fixed voltage node G1. An output of the operational amplifier 136 is coupled to the sensor base 128 of the sensor transistor QS1. A negative input is coupled to a node between the sensor emitter 132 and the second emitter resistor RE2. A second voltage V2 is sensed by the negative input. The first emitter resistor RE1 and the second emitter resistor RE2 set the current scale ratio in Equation 7. The operation amplifier can be implemented in a bipolar transistor, a complementary metal oxide semiconductor, or a field-effect transistor fabrication process.

$$V_1 \approx V_2 \quad (6)$$

$$I_{debias} = \frac{R_{E1}}{R_{E2}} \cdot I_{sense} \quad (7)$$

A distributed resistor network implementation of common-emitter power adaptive biasing is shown in FIG. 11. This implementation is practical in power amplifiers due to frequent multiple cells used per stage. Carrier sense resistors $cR_{SENSE1}$ through $cR_{SENSE-N}$ each having a resistance value cRsense are integrated into the power stage either partially or wholly with the effective Rsense=Rsense1+cRsense/N, where N is the number of unit cell devices in the power stage. Isolation resistors $pR_{ISO1}$ through $pR_{ISO-N}$ each have a resistance value of $pR_{ISO}$ and are distributed to the power stage. An effective total Riso=pRiso/N.

A first carrier bias input 138 is coupled to the positive carrier base 58 through a first carrier base resistor $cR_{bb1}$. An Nth carrier bias input 138-N is coupled to an Nth carrier base 58-N. The carrier power bias generator 78 (FIG. 1) may be coupled to the positive carrier base 58 through the Nth carrier bias input 138-N to bias first carrier power transistors Q3 through Q3-N.

A first peaking bias input 140 is coupled to the positive peaking base 88 through a first peaking base resistor $pR_{bb1}$. An Nth peaking bias input 140-N is coupled to an Nth peaking base 88-N. The peaking power bias generator 112 (FIG. 1) may be coupled to the positive peaking base 88 through the Nth peaking bias input 140-N to bias first peaking power transistors Q5 through Q5-N.

A fully distributed network implementation of the common-emitter power adaptive biasing is shown in FIG. 12. The sensing resistor $R_{SENSE1}$, the filter capacitor $C_{FILT1}$, and the sensor transistor QS1 are integrated into the cPA power stage per cell. Rsio is distributed to the pPA power stage.

A distributed resistor network implementation of current mirror power adaptive biasing is shown in FIG. 13. This implementation is also practical in power amplifiers due to frequent multiple cells used per stage. The sensing resistor $R_{SENSE1}$ is integrated into the power stage either partially or wholly with effective Rsense=Rsense1+cRsense/n. Rsio is distributed to the power stage: effective total Riso=pRiso/n. This embodiment leaves the mirror transistor QMIR1 as lumped to save the power cell layout footprint.

Another practical distributed implementation of the current mirror power adaptive biasing is shown in FIG. 14. The sensing resistor $R_{SENSE1}$ is integrated into the power stage either partially or wholly with effective Rsense=Rsense1+ cRsense/n. Rsio is distributed to the power stage with the effective total Riso=pRiso/n. This embodiment according to the present disclosure also distributes and integrates mirror transistors pQMIR1 through pQMIR-N into the power stage layout with a potentially larger implementation area. When the pQmir device output impedance is very high at RF frequencies, pRiso may be removed.

The present bias adaptation method based on sensing power amplifier base voltage and scaling control current with a common-emitter mode bipolar device is applied to a single-ended Doherty power amplifier in a silicon, gallium arsenide, silicon germanium, or indium phosphorus, bipolar junction transistor fabrication process. Each of the transistors making up the differential Doherty power amplifier 10 can be an NMOS device fabricated in a BiCMOS process. Each of the transistors making up the differential Doherty power amplifier 10 can also be an NFET device fabricated in a BiFET process.

The present general power adaptation method may also be based on sensing the power amplifier base voltage and scaling the control current with a common-emitter mode bipolar device for applications other than power amplifier bias control. The common-emitter BJT can be replaced with an NMOS device in a BiCMOS process or an NFET device in a BiFET process.

The present bias adaptation method may further be based on sensing power amplifier base voltage and scaling control current with a current mirror and applied to a single-ended Doherty power amplifier in Si, GaAs, SiGe or InP HBT process. The current mirror can be implemented with an NMOS pair in a BiCMOS process or an NFET pair in BiFET process.

A general power adaptation method is based on sensing power amplifier base voltage and scaling control current with a current mirror for applications other than power amplifier bias control. The current mirror can be implemented with NMOS pair in BiCMOS process or an NFET pair in BiFET process.

With reference to FIG. 15, the concepts described above may be implemented in various types of wireless communication devices or user elements 142, such as mobile terminals, smart watches, tablets, computers, navigation devices, access points, and the like that support wireless communications, such as cellular, wireless local area network (WLAN), Bluetooth, and near-field communications. The user elements 142 will generally include a control system 144, a baseband processor 146, transmit circuitry 148 that includes the Doherty power amplifier 10, receive circuitry 150, antenna switching circuitry 152, multiple antennas 154, and user interface circuitry 156. The receive circuitry 150 receives radio frequency signals via the antennas 154 and through the antenna switching circuitry 152 from one or more basestations. A low-noise amplifier and a filter (not shown) cooperate to amplify and remove broadband interference from the received signal for processing. Downconversion and digitization circuitry (not shown) will then downconvert the filtered, received signal to an intermediate or baseband frequency signal, which is then digitized into one or more digital streams.

The baseband processor 146 processes the digitized received signal to extract the information or data bits conveyed in the received signal. This processing typically comprises demodulation, decoding, and error correction operations. The baseband processor 146 is generally implemented in one or more digital signal processors (DSPs) and application-specific integrated circuits (ASICs).

For transmission, the baseband processor 146 receives digitized data, which may represent voice, data, or control information, from the control system 144, which it encodes for transmission. The encoded data are output to the transmit circuitry 148, where they are used by a modulator (not shown) to modulate a carrier signal that is at a desired transmit frequency or frequencies. A power amplifier (not shown) will amplify the modulated carrier signal to a level appropriate for transmission and deliver the modulated carrier signal to the antennas 154 through the antenna switching circuitry 152. The antennas 154 and the replicated transmit and receive circuitries 148, 150 may provide spatial diversity. Modulation and processing details will be understood by those skilled in the art.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. An amplifier comprising:
a carrier amplifier having a common-emitter carrier power stage;
a peaking amplifier having a common-emitter peaking power stage; and
power adaptive biasing circuitry coupled between the carrier amplifier and the peaking amplifier, wherein the power adaptive biasing circuitry is configured to sense direct current base voltages of the common-emitter carrier power stage and to generate control currents that debias the common-emitter carrier power stage in response to the current base voltages of the common-emitter carrier power stage.

2. The amplifier of claim 1 wherein the common-emitter carrier power stage comprises:
a first carrier power transistor having a first carrier emitter coupled to a fixed voltage node, a first carrier base, and a first carrier collector, and a second carrier emitter coupled to the fixed voltage node, a second carrier base, and a second carrier collector; and
a first peaking power transistor having a first peaking emitter coupled to the fixed voltage node, a first peaking base, and a first peaking collector.

3. The amplifier of claim 2 wherein the power adaptive biasing circuitry comprises:
power adaptive biasing positive (PABP) circuitry coupled between the first carrier base and the first peaking base, wherein the PABP circuitry is configured to sense one of the direct current base voltages that is a direct current base voltage of the first carrier power transistor and in response to generate one of the control currents that debiases the first peaking power transistor; and
power adaptive biasing negative (PABN) circuitry coupled between the second carrier base and the second peaking base, wherein the PABN circuitry is configured to sense one of the direct current base voltages that is a direct current base voltage of the second carrier power transistor and in response to generate one of the control currents that debiases the second peaking power transistor.

4. The amplifier of claim 3 wherein the PABP circuitry comprises:
a sensor transistor having a sensor emitter coupled to the fixed voltage node, a sensor base, and a sensor collector;
a sense resistor coupled between the first carrier base and the sensor base; and
an isolation resistor coupled between the sensor collector and the first peaking base.

5. The amplifier of claim 4 wherein the PABP circuitry further comprises a filter capacitor coupled between the sensor base and the fixed voltage node.

6. The amplifier of claim 3 wherein the PABN circuitry comprises:
a sensor transistor having a sensor emitter coupled to the fixed voltage node, a sensor base, and a sensor collector;
a sense resistor coupled between the second carrier base and the sensor base; and
an isolation resistor coupled between the sensor collector and the second peaking base.

7. The amplifier of claim 6 wherein the PABN circuitry further comprises a filter capacitor coupled between the sensor base and the fixed voltage node.

8. The amplifier of claim 3 wherein the PABP circuitry comprises:
a reference transistor having a reference emitter coupled to the fixed voltage node, a reference base, and a reference collector coupled to the reference base;
a mirror transistor having a mirror emitter coupled to the fixed voltage node, a mirror base coupled to the reference base, and a mirror collector;
a sense resistor coupled between the first carrier base and the reference collector; and
an isolation resistor coupled between the mirror collector and the first peaking base.

9. The amplifier of claim 8 wherein the PABP circuitry further comprises a filter capacitor coupled between the reference collector and the fixed voltage node.

10. The amplifier of claim 3 wherein the PABN circuitry comprises:
a reference transistor having a reference emitter coupled to the fixed voltage node, a reference base, and a reference collector coupled to the reference base;
a mirror transistor having a mirror emitter coupled to the fixed voltage node, a mirror base coupled to the reference base, and a mirror collector;
a sense resistor coupled between the second carrier base and the reference collector; and
an isolation resistor coupled between the mirror collector and the second peaking base.

11. The amplifier of claim 8 wherein the PABN circuitry further comprises a filter capacitor coupled between the reference collector and the fixed voltage node.

12. The amplifier of claim 1 wherein the fixed voltage node is ground.

13. A method for amplifying a signal, using an amplifier comprising a carrier amplifier having a common-emitter carrier power stage, a peaking amplifier having a common-emitter peaking power stage, and power adaptive biasing circuitry coupled between the carrier amplifier and the peaking amplifier, the method comprising:
sensing direct current base voltages of the common-emitter carrier power stage; and
generating control currents that debias the common-emitter carrier power stage in response to the current base voltages of the common-emitter carrier power stage.

14. The method of claim 13 wherein the power adaptive biasing circuitry comprises power adaptive biasing positive (PABP) circuitry coupled between a first carrier base and a first peaking base and power adaptive biasing negative (PABN) circuitry coupled between a second carrier base and a second peaking base, the method further comprising:
sensing one of the direct current base voltages that is a direct current base voltage of a first carrier power transistor;
generating one of the control currents that debiases a first peaking power transistor in response to a sensed direct current base voltage of the first carrier power transistor;
sensing another one of the direct current base voltages that is a direct current base voltage of a second carrier power transistor; and
generating another one of the control currents that debiases a second peaking power transistor in response to a sensed direct current base voltage of the second carrier power transistor.

15. The method of claim 13 wherein the fixed voltage node is ground.

16. A wireless communication device comprising:
a baseband processor;
transmit circuitry configured to receive encoded data from the baseband processor and to modulate a carrier signal with the encoded data, wherein the transmit circuitry comprises:
a carrier amplifier having a common-emitter carrier power stage;
a peaking amplifier having a common-emitter peaking power stage;
power adaptive biasing circuitry coupled between the carrier amplifier and the peaking amplifier, wherein the power adaptive biasing circuitry is configured to sense direct current base voltages of the common-emitter carrier power stage and to generate control currents that debias the common-emitter carrier power stage in response to the current base voltages of the common-emitter carrier power stage; and
at least one antenna coupled to the transmit circuitry to transmit the carrier signal.

17. The wireless communications device of claim 16 wherein the common-emitter carrier power stage comprises:
a first carrier power transistor having a first carrier emitter coupled to a fixed voltage node, a first carrier base, and a first carrier collector, and a second carrier emitter coupled to the fixed voltage node, a second carrier base, and a second carrier collector; and
a first peaking power transistor having a first peaking emitter coupled to the fixed voltage node, a first peaking base, and a first peaking collector.

18. The wireless communication device of claim 16 wherein the power adaptive biasing circuitry comprises:
power adaptive biasing positive (PABP) circuitry coupled between the first carrier base and the first peaking base, wherein the PABP circuitry is configured to sense one of the direct current base voltages that is a direct current base voltage of the first carrier power transistor and in response to generate one of the control currents that debiases the first peaking power transistor; and
power adaptive biasing negative (PABN) circuitry coupled between the second carrier base and the second peaking base, wherein the PABN circuitry is configured to sense one of the direct current base voltages that is a direct current base voltage of the second carrier power transistor and in response to generate one of the control currents that debiases the second peaking power transistor.

19. The wireless communications device of claim 18 wherein the PABP circuitry comprises:
a sensor transistor having a sensor emitter coupled to the fixed voltage node, a sensor base, and a sensor collector;
a sense resistor coupled between the first carrier base and the sensor base; and
an isolation resistor coupled between the sensor collector and the first peaking base.

20. The wireless communications device of claim 19 wherein the PABP circuitry further comprises a filter capacitor coupled between the sensor base and the fixed voltage node.

21. The wireless communications device of claim 18 wherein the PABN circuitry comprises:
a sensor transistor having a sensor emitter coupled to the fixed voltage node, a sensor base, and a sensor collector;
a sense resistor coupled between the second carrier base and the sensor base; and
an isolation resistor coupled between the sensor collector and the second peaking base.

22. The wireless communications device of claim 21 wherein the PABN circuitry further comprises a filter capacitor coupled between the sensor base and the fixed voltage node.

23. The amplifier of claim 18 wherein the PABP circuitry comprises:
a reference transistor having a reference emitter coupled to the fixed voltage node, a reference base, and a reference collector coupled to the reference base;
a mirror transistor having a mirror emitter coupled to the fixed voltage node, a mirror base coupled to the reference base, and a mirror collector;
a sense resistor coupled between the first carrier base and the reference collector; and
an isolation resistor coupled between the mirror collector and the first peaking base.

24. The wireless communication device of claim 23 wherein the PABP circuitry further comprises a filter capacitor coupled between the reference collector and the fixed voltage node.

25. The wireless communication device of claim 18 wherein the PABN circuitry comprises:
a reference transistor having a reference emitter coupled to the fixed voltage node, a reference base, and a reference collector coupled to the reference base;
a mirror transistor having a mirror emitter coupled to the fixed voltage node, a mirror base coupled to the reference base, and a mirror collector;
a sense resistor coupled between the second carrier base and the reference collector; and
an isolation resistor coupled between the mirror collector and the second peaking base.

26. The wireless communication device of claim 18 wherein the PABN circuitry further comprises a filter capacitor coupled between the reference collector and the fixed voltage node.

27. The wireless communication device of claim 16 wherein the fixed voltage node is ground.

* * * * *

UNITED STATES PATENT AND TRADEMARK OFFICE
CERTIFICATE OF CORRECTION

| | | |
|---|---|---|
| PATENT NO. | : 12,463,595 B2 | Page 1 of 1 |
| APPLICATION NO. | : 18/163575 | |
| DATED | : November 4, 2025 | |
| INVENTOR(S) | : Ming Ji and Douglas Andrew Teeter | |

It is certified that error appears in the above-identified patent and that said Letters Patent is hereby corrected as shown below:

In the Specification

In Column 2, at Line 29, change "PAB sense" to read --PAB Isense--

In Column 7, at Line 9, change "class Aft" to read --class AB--

In Column 8, at Line 40, change "scaling factor of B" to read --scaling factor of ß--

Signed and Sealed this
Twenty-third Day of December, 2025

John A. Squires
*Director of the United States Patent and Trademark Office*